US010042767B2

(12) United States Patent
Cho et al.

(10) Patent No.: US 10,042,767 B2
(45) Date of Patent: Aug. 7, 2018

(54) ELECTRONIC DEVICE AND METHOD FOR FABRICATING THE SAME

(71) Applicant: SK hynix Inc., Icheon (KR)

(72) Inventors: Jong-Young Cho, Hanam (KR); Eung-Rim Hwang, Seoul (KR); In-Hoe Kim, Seoul (KR); Young-Min Na, Seoul (KR); Gwang-Won Lee, Suwon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 15/458,888

(22) Filed: Mar. 14, 2017

(65) Prior Publication Data

US 2018/0018263 A1    Jan. 18, 2018

(30) Foreign Application Priority Data

Jul. 12, 2016    (KR) .......................... 10-2016-0087803

(51) Int. Cl.
 *G11C 11/00* (2006.01)
 *G06F 12/0831* (2016.01)
 (Continued)

(52) U.S. Cl.
 CPC ...... *G06F 12/0831* (2013.01); *G06F 12/0802* (2013.01); *G06F 13/1673* (2013.01); *H01L 27/224* (2013.01); *H01L 27/2409* (2013.01); *H01L 27/2463* (2013.01); *H01L 43/02* (2013.01); *H01L 43/08* (2013.01); *H01L 43/12* (2013.01); *H01L 45/1233* (2013.01); *H01L 45/1253* (2013.01); *H01L 45/16* (2013.01);
 (Continued)

(58) Field of Classification Search
 CPC . G11C 11/00; G06F 12/0802; G06F 13/1673; G06F 12/0831; H01L 27/224
 USPC ......................................................... 365/148
 See application file for complete search history.

(56) References Cited

U.S. PATENT DOCUMENTS 8,557,649 B2    10/2013    Venigalla et al.
9,178,141 B2    11/2015    Liu
(Continued)

FOREIGN PATENT DOCUMENTS

KR    10-01332640000 B1    12/1997

OTHER PUBLICATIONS

Christopher L. Borst et al., "Chemical-mechanical polishing of SiOC organosilicate glasses: the effect of film carbon content", Thin Solid Films, 2001, pp. 281-292, vol. 385, Elsevier Science B. V.
(Continued)

*Primary Examiner* — Harry W Byrne

(57) ABSTRACT

An electronic device is provided. An electronic device according to an implementation of the disclosed technology is an electronic device including a semiconductor memory, wherein the semiconductor memory includes: a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region.

17 Claims, 9 Drawing Sheets

(51) Int. Cl.
  *H01L 27/24* (2006.01)
  *H01L 45/00* (2006.01)
  *H01L 27/22* (2006.01)
  *H01L 43/02* (2006.01)
  *H01L 43/08* (2006.01)
  *H01L 43/12* (2006.01)
  *G06F 12/0802* (2016.01)
  *G06F 13/16* (2006.01)

(52) U.S. Cl.
  CPC .... *G06F 2212/60* (2013.01); *G06F 2212/621* (2013.01)

(56) References Cited

U.S. PATENT DOCUMENTS

2005/0287738 A1* 12/2005 Cho ............... H01L 21/31116
                                              438/253
2014/0306351 A1* 10/2014 Kim ............... H01L 21/76855
                                              257/774

OTHER PUBLICATIONS

Ban Ito et al., "CMP process for selectiovely grown carbon nanotubes in via structure", International Conference on Planarization/CMP Technology, Nov. 19-21, 2014, pp. 100-104, IEEE.

Christopher L. Borst et al., "Chemical Mechanical Polishing of Low Dielectric Constant Polymers in Copper Slurries", Journal of the Electrochemical Society, 1999, pp. 4309-4315, The Electrochemical Society, Inc.

\* cited by examiner

ELECTRONIC DEVICE AND METHOD FOR FABRICATING THE SAME

CROSS-REFERENCE TO RELATED APPLICATIONS

The present application claims priority of Korean Patent Application No. 10-2016-0087803, entitled "ELECTRONIC DEVICE AND METHOD FOR FABRICATING THE SAME" and filed on Jul. 12, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which fabricating processes can be easily performed and electrical characteristics and operating characteristics of memory cells can be improved.

In an implementation, an electronic device including a semiconductor memory is provided wherein the semiconductor memory includes: a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region.

Implementations of the above electronic device may include one or more the following.

The first conductive carbon-containing pattern includes graphite or carbon nanotubes. The first insulating carbon-containing pattern includes SiC, SiCN, SiOC, SiOCN, DLC (Diamond-like carbon) or amorphous carbon. The first insulating carbon-containing pattern has a carbon content of from 10 wt % to 100 wt %. A height of a top surface of the first insulating carbon-containing pattern is equal to or greater than a height of a top surface of each first conductive carbon-containing pattern. A height of a bottom surface of the first insulating carbon-containing pattern is equal to or less than the height of the top surface of each first conductive carbon-containing pattern while being equal to or greater than a height of a bottom surface of each first conductive carbon-containing pattern. A height of a portion of a top surface of the first interlayer insulating layer in the first region is substantially equal to a height of a top surface of the first conductive carbon-containing pattern. A height of a portion of a top surface of the first interlayer insulating layer under the first insulating carbon-containing pattern in the second region is less than the height of the portion of the top surface of the first interlayer insulating layer in the first region. The semiconductor memory further comprises: a plurality of first lines disposed over the substrate and under the first memory cells in the first region and extending in a first direction; and a plurality of second lines disposed over the first interlayer insulating layer in the first region, and extending in a second direction crossing the first direction while contacting the first conductive carbon-containing patterns, and wherein the first memory cells are located at intersections of the first lines and the second lines. Each of the first memory cells includes a variable resistance layer which switches between different resistance states according to an applied voltage or current, and wherein the first conductive carbon-containing pattern is located over the variable resistance layer. Each of the first memory cells further includes a selection element layer which controls access to the variable resistance layer, and wherein the selection element layer is located under the variable resistance layer or between the first conductive carbon-containing pattern and the variable resistance layer. The semiconductor memory further comprises: a second interlayer insulating layer covering the first interlayer insulating layer, the second lines and the first insulating carbon-containing pattern; a plurality of second memory cells disposed in the first region, penetrating through a first portion of the second interlayer insulating layer in the first region and coupled to the second lines, an uppermost portion of each of the second memory cells having a second conductive carbon-containing pattern; a second insulating carbon-containing pattern located over a second portion of the second interlayer insulating layer in the second region; and a plurality of third lines disposed over the second interlayer insulating layer in the first region, and extending in the first direction while contacting the second conductive carbon-containing patterns, and wherein the second memory cells are located at intersections of the second lines and the thirds lines.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device including a semiconductor memory includes: providing a substrate including a first region in which a plurality of memory cells are to be disposed and a second region adjacent to the first region; forming first stack structures, each including a first memory cell and a first hard mask pattern disposed over the first memory cell, over the substrate in the first region, an uppermost portion of each first memory cell having a first conductive carbon-containing pattern; forming a first interlayer insulating layer over the first stack structures, a top surface of a first portion of the first interlayer insulating layer in the first region being higher than a top surface of a second portion of the first interlayer insulating layer in the second region; forming a first polishing stop layer including an insulating carbon-containing material over the first interlayer insulating layer; removing a portion of the first polishing stop layer in the first region; and performing a polishing process on a resultant structure of the process of removing the portion of the first polishing stop layer in the first region until the first conductive carbon-containing patterns are exposed.

Implementations of the above method may include one or more the following.

The first conductive carbon-containing pattern includes graphite or carbon nanotubes. The insulating carbon-containing material includes SiC, SiCN, SiOC, SiOCN, DLC (Diamond-like carbon) or amorphous carbon. A height of the top surface of the portion of first interlayer insulating layer in the second region is equal to or less than a height of a top surface of the first conductive carbon-containing patterns. A height of a top surface of a portion of the first polishing stop layer in the second region is equal to or greater than a height of a top surface of each of the first conductive carbon-containing patterns. The method, after forming the first polishing stop layer, further comprises: forming an additional first interlayer insulating layer over the first polishing stop layer; and polishing the additional first interlayer insulating layer until the first polishing stop layer of the first region is exposed, wherein removing the portion of the first polishing stop layer of the first region is performed by an etching process. The method further comprises: forming a plurality of first lines over the substrate and under the first stack structures in the first region and extending in a first direction, before forming the first stack structures; and forming a plurality of second lines which extend in a second direction crossing the first direction and contact the first conductive carbon-containing patterns, after performing the polishing process. The method further comprises: forming second stack structures, each including a second memory cell and a second hard mask pattern disposed over the second memory cell, over the second lines, an uppermost portion of each second memory cell having a second conductive carbon-containing pattern; forming a second interlayer insulating layer over the second stack structures, a top surface of a portion of the second interlayer insulating layer in the first region being higher than a top surface of a portion of the second interlayer insulating layer in the second region; forming a second polishing stop layer including an insulating carbon-containing material over the second interlayer insulating layer; removing a portion of the second polishing stop layer in the first region; and performing a polishing process on a resultant structure of the process of removing the portion of the second polishing stop layer in the first region until the second conductive carbon-containing patterns are exposed.

These and other aspects, implementations and associated advantages are described in greater detail in the drawings, the description and the claims.

DETAILED DESCRIPTION

Figure 1A:
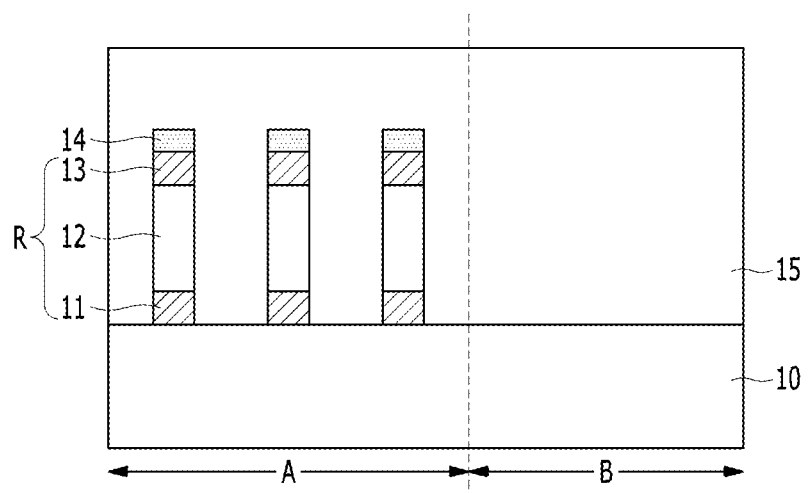
FIGS. 1A and 1B are cross-sectional views illustrating a method for fabricating a semiconductor memory of a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to the description of the implementations, a semiconductor memory of a comparative example, a fabricating method thereof and a problem thereof will be described.

Figure 1B:
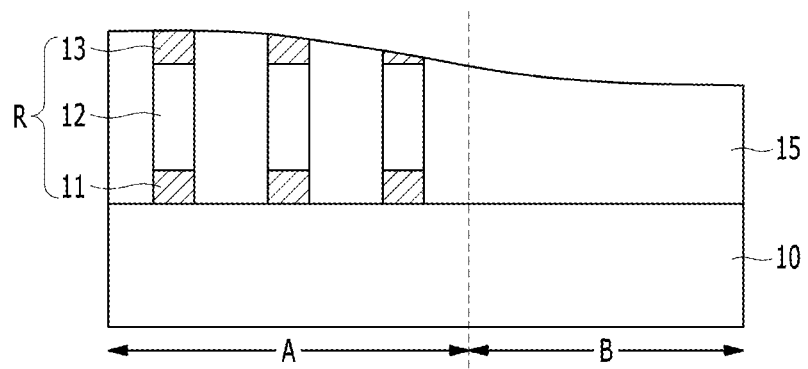

FIGS. 1A and 1B are cross-sectional views illustrating a method for fabricating a semiconductor memory of a comparative example.

Referring to FIG. 1A, a substrate 10 in which a first region A and a second region B are defined may be provided. The first region A may be a region in which a plurality of memory cells are to be formed. The second region B may be a region in which a peripheral circuit is to be formed while being adjacent to the first region A.

Then, the plurality of memory cells, for example, a plurality of variable resistance elements R may be formed over the substrate 10 of the first region A. The variable resistance element R may be an element which can switch between different resistance states according to a voltage or current applied through its upper and lower electrodes. The variable resistance element R may include a lower electrode 11 and an upper electrode 13 which are located at the lowermost portion and the uppermost portion of the variable resistance element R, respectively, and a variable resistance material 12 interposed between the lower electrode 11 and the upper electrode 13. A hard mask pattern 14 used in patterning the variable resistance element R may be disposed over the variable resistance element R. The hard mask pattern 14 may be formed of an insulating material.

Then, an interlayer insulating layer 15 may be formed to cover a resultant structure including the variable resistance elements R that are formed over the substrate 10.

Referring to FIG. 1B, a polishing process such as a CMP (Chemical Mechanical Polishing) process may be performed on the interlayer insulating layer 15 until the hard mask pattern 14 is removed and the upper electrode 13 is exposed.

However, when a degree of polishing is insufficient during the polishing process, the hard mask pattern 14 which has an insulating property may remain over the upper electrode 13 and the upper electrode 13 may not be exposed. On the other hand, when a degree of polishing is excessive, as shown in FIG. 1B, the variable resistance element R may be excessively polished such that the upper electrode 13 is damaged. Furthermore, depending on a position of the variable resistance element R, a degree of damage of the upper electrode 13 may vary. For example, upper electrodes 13 of variable resistance elements R that are located relatively close to an edge of the first region A, that is, closer to the second region B, may be more damaged than upper electrodes 13 of variable resistance elements R located closer to a center of the first region A. Therefore, it is difficult to ensure uniformity of characteristics of the variable resistance elements R, and the high level of precision of associated polishing processes is problematic.

Also, during the polishing process, a height of a top surface of the interlayer insulating layer 15 of the second region B may be reduced to a lower height than that of the first region A in which the variable resistance elements R are densely located. That is, a large height difference, which may be referred to as a step height, may occur between the first region A and the second region B. This may make subsequent processes, for example, a process of forming some elements over a resultant structure of FIG. 1B, difficult.

In the present implementations, the above problems may be solved by providing a semiconductor memory and a method for fabricating the same, which can increase a polishing margin and secure characteristics of variable resistance elements.

Figure 2:
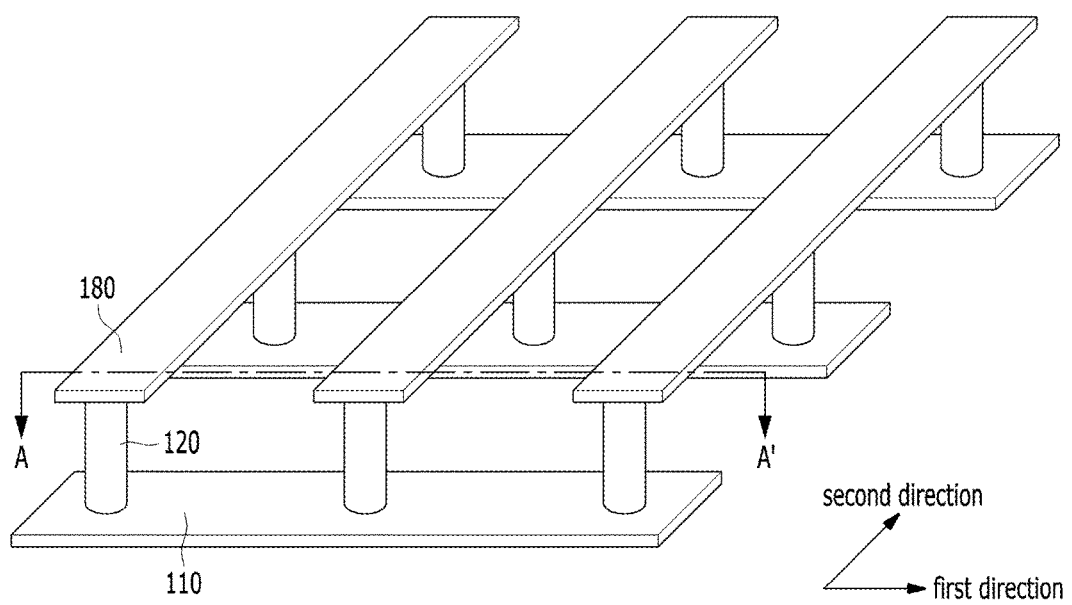
FIG. 2 is a perspective view illustrating a semiconductor memory according to an implementation of the disclosed technology.

FIG. 2 is a perspective view illustrating a semiconductor memory according to an implementation of the disclosed technology.

Referring to FIG. 2, the semiconductor memory of the present implementation may have a cross-point structure which includes first lines 110 extending in a first direction, second lines 180 located over the first lines 110 and extending in a second direction crossing the first direction, and memory cells 120 located at intersections of the first lines 110 and the second lines 180 between the first lines 110 and the second lines 180.

FIGS. 3A to 3E are cross-sectional views illustrating a semiconductor memory according to an implementation of the disclosed technology, and a method for fabricating the same. A first region A of FIGS. 3A to 3E, which will be described below, is illustrated from the perspective of a cross-sectional view taken along line A-A' of FIG. 2.

Figure 3A:
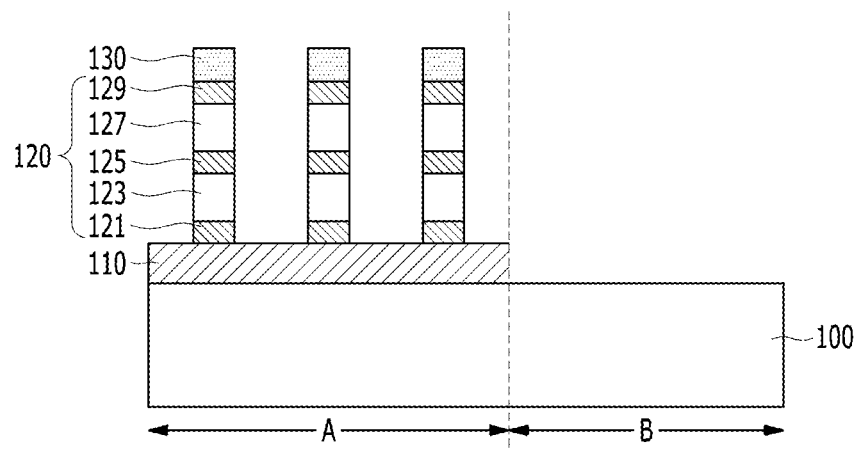
FIGS. 3A to 3E are cross-sectional views illustrating a semiconductor memory according to an implementation of the disclosed technology, and a method for fabricating the same.

Referring to FIG. 3A, a substrate 100 in which the first region A and a second region B are defined and circuitry and wiring elements (not shown) are formed may be provided.

The first region A may be a memory cell region in which a plurality of memory cells are to be formed. The second region B may be disposed adjacent to the first region A and be a peripheral circuit region in which a peripheral circuit is to be formed. The circuitry and wiring elements (not shown) formed in the substrate 100 may be used for implementation of the first region A and/or the second region B, and include transistors, conductive lines, etc.

Then, first lines 110 extending in a first direction may be formed over the substrate 100 of the first region A. The first lines 110 may have a single-layered structure or multi-layered structure including a conductive material such as a metal, a metal nitride, etc. The first lines 110 may be formed by depositing the conductive material and performing a patterning process. Spaces between the first lines 110 may be filled with an insulating material (not shown).

Then, a plurality of memory cells 120 may be formed over the first lines 110. In the implementation shown in FIG. 3A, each of the memory cells 120 has a pillar shape and is located at each of intersections of the first lines 110 and second lines, which will be described later. The memory cells 120 may be formed by depositing material layers over the first lines 110 and the insulating material between the first lines 110, forming a hard mask pattern 130 over the material layers, and etching the material layers using the hard mask pattern 130 as an etching barrier. Therefore, the hard mask pattern 130 may be disposed over the memory cell 120 while having a sidewall aligned with a sidewall of the memory cell 120. The hard mask pattern 130 may have a single-layered structure or multi-layered structure including an insulating material such as a silicon oxide, a silicon nitride, a silicon oxynitride, etc. The combination of a memory cell 120 and a hard mask pattern 130 may be referred to as a stack structure.

Also, in the present implementation, the memory cell 120 may include a lower electrode layer 121, a selection element layer 123, a middle electrode layer 125, a variable resistance layer 127 and an upper electrode layer 129 which are sequentially stacked.

Specifically, the lower electrode layer 121 may be located at a lowermost portion of the memory cell 120 and serve as a transmission path of a voltage or current between a corresponding one of the first lines 110 and the memory cell 120. The middle electrode layer 125 may physically separate the selection element layer 123 from the variable resistance layer 127, and electrically couple the selection element layer 123 to the variable resistance layer 127. Each of the lower electrode layer 121 and the middle electrode layer 125 may have a single-layered structure or multi-layered structure including a conductive material such as a metal, a metal nitride, a conductive carbon material, etc. In some implementations, at least one of the lower electrode layer 121 and the middle electrode layer 125 may be omitted.

The upper electrode layer 129 may be located at the uppermost portion of the memory cell 120 and serve as a transmission path of a voltage or current between the memory cell 120 and a corresponding one of the second lines which will be described later. Furthermore, since it is desirable to minimize the damage of the upper electrode layer 129 during a subsequent polishing process, a material having a low reactivity with a polishing slurry may be used to form the upper electrode layer 129. For such an implementation, the upper electrode layer 129 may include a conductive carbon material, for example, a graphite, a carbon nanotube, etc. For reference, it is generally known that a carbon-containing material has a low reactivity with a slurry, although there is a slight difference depending on the pH of the slurry. The reactivity between the carbon-containing material and the slurry may be reduced as a carbon content of the carbon-containing material increases. The graphite and/or the carbon nanotube may have a carbon content which is about 100%, thereby having a high resistance to the polishing.

The variable resistance layer 127 may switch between different resistance states according to a voltage or current applied thereto through its upper and lower electrodes, e.g., the upper electrode layer 129 and the middle electrode layer 125, to thereby store different data. For example, when the variable resistance layer 127 is in a low resistance state, data '1' may be stored. On the other hand, when the variable resistance layer 127 is in a high resistance state, data '0' may be stored. The variable resistance layer 127 may include at least one of various materials that are used in RRAM, PRAM, FRAM, MRAM or the like, for example, metal oxides such as transition metal oxides or perovskite-based materials, phase-change materials such as chalcogenide-based materials, ferroelectric materials, ferromagnetic materials or the like. The variable resistance layer 127 may have a single-layered structure or a multi-layered structure which shows a variable resistance characteristic by a combination of two or more layers. However, other implementations are also possible. For example, the memory cell 120 may include a memory layer which can store various types of data in various ways, instead of the variable resistance layer 127.

The selection element layer 123 may control access to the variable resistance layer 127. For this, the selection element layer 123 may have a selection element characteristic which does not substantially pass a current therethrough when a magnitude of an applied voltage or current is lower than a critical value, and can pass a current that sharply increases in proportion to the magnitude of the applied voltage or current when the magnitude of the applied voltage or current exceeds the critical value. An MIT (metal insulator transition) element such as $NbO_2$ or $TiO_2$, an MIEC (mixed ion-electron conducting) element such as $ZrO_2$ $(Y_2O_3)$, $Bi_2O_3$—$BaO$ or $(La_2O_3)x(CeO_2)1-x$, an OTS (ovonic threshold switching) element including a chalcogenide-based material such as $Ge_2Sb_2Te_5$, $As_2Te_3$, $As_2$ or $As_2Se_3$, or a tunneling dielectric layer including at least one of various dielectric materials such as a silicon oxide, a silicon nitride, a metal oxide and the like and having a small thickness to allow a tunneling of electrons under a certain voltage or current, may be used as the selection element layer 123. The selection element layer 123 may have a single-layered structure or a multi-layered structure which exhibits the selection element characteristic by a combination of two or more layers. In some implementations, the selection element layer 123 may be omitted. In another implementation, the positions of the selection element layer 123 and the variable resistance layer 127 may be reversed with respect to the orientation shown in FIG. 3A.

Figure 3B:
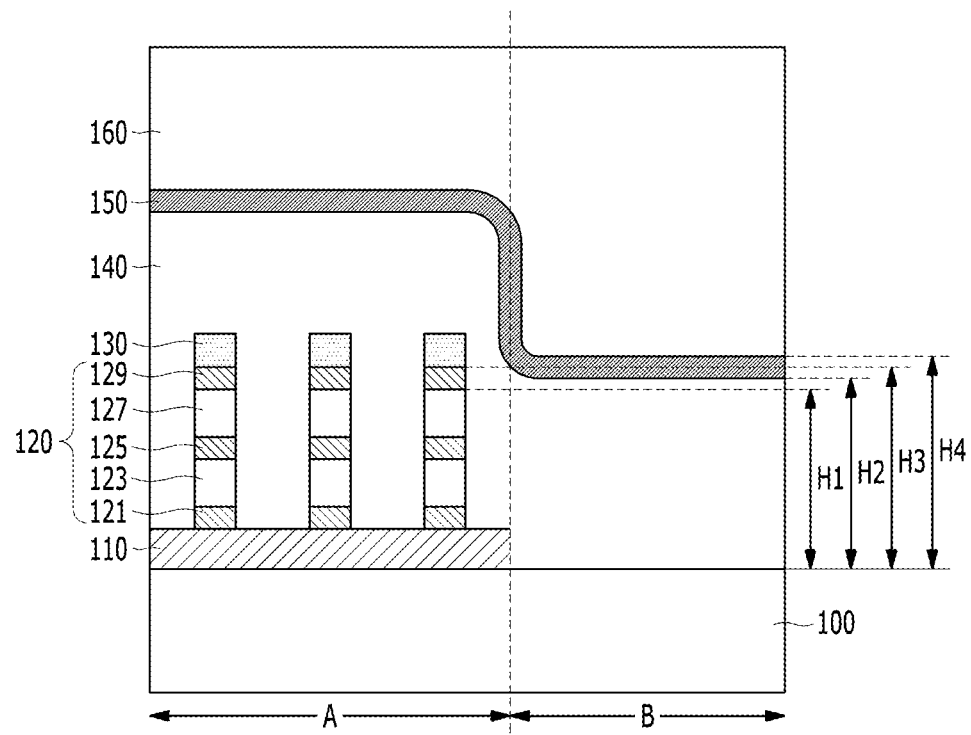

Referring to FIG. 3B, a first interlayer insulating layer 140 may be formed over a resultant structure of FIG. 3A. The first interlayer insulating layer 140 may include at least one of various insulating materials such as a silicon oxide, a silicon nitride, a silicon oxynitride, etc.

The first interlayer insulating layer 140 may be formed over a lower profile of the semiconductor memory. Therefore, a top surface of the first interlayer insulating layer 140 may be higher in the first region A in which the memory cells 120 are formed relative to in the second region B. The top surface of interlayer insulating layer 140 may transition between the two levels at a non-parallel orientation with respect to a top surface of the substrate 100 at a boundary between the first region A and the second region B. For example, the top surface of the first interlayer insulating layer 140 in the boundary between the first region A and the second region B may be substantially perpendicular to the top surface of the substrate 100.

Next, a polishing stop layer 150 may be formed over the first interlayer insulating layer 140. The polishing stop layer 150 may have a substantially uniform thickness in the first region A and the second region B.

As shown in FIG. 3B, a height from the substrate 100 to a bottom surface of the upper electrode layer 129 is referred to as a first height H1, a height from the substrate 100 to a top surface of the first interlayer insulating layer 140 in the second region B, that is, to a bottom surface of the polishing stop layer 150 in the second region B, is referred to as a second height H2, a height from the substrate 100 to a top surface of the upper electrode layer 129 is referred to as a third height H3, and a height from the substrate 100 to a top surface of the polishing stop layer 150 in the second region B is referred to as a fourth height H4. The fourth height H4 may be substantially equal to or greater than the third height H3. Furthermore, the second height H2 may be substantially equal to or less than the third height H3 while being similar to the first height H1.

In the present implementation, the second height H2 is between the first height H1 and the third height H3. However, in other implementations, the second height H2 may be equal to the third height H3 or the first height H1, or slightly less than the first height H1. The heights are height in a vertical direction, which is a direction in which layers are stacked on the substrate 100, or a direction that is perpendicular to the primary plane of the substrate 100. The polishing stop layer 150 of the second region B may overlap at least a portion of the upper electrode layer 129 in the vertical direction, and the height of the top surface of the polishing stop layer 150 of the second region B may be equal to or greater than the height of the top surface of the upper electrode layer 129.

The polishing stop layer 150 may include a carbon-containing material which has an insulating characteristic, that is, a high specific resistance. For example, the polishing stop layer 150 may include a SiC layer, a SiCN layer, a SiOC layer, a SiOCN layer, a DLC (Diamond-like carbon) layer or an amorphous carbon layer. A carbon content of the polishing stop layer 150 may have a range of from 10 wt % to 100 wt %. Since the carbon-containing material has a low reactivity with a polishing slurry and the reactivity is reduced by an increase in a hydrophobic property of the carbon-containing material as the carbon content of the carbon-containing material increases as described above, in some implementations, the carbon content of the polishing stop layer 150 is 100 wt % or close to 100 wt %.

Then, an additional interlayer insulating layer 160 may be formed over the polishing stop layer 150. The additional interlayer insulating layer 160 may include at least one of various insulating materials such as silicon oxide, silicon nitride, silicon oxynitride, etc. The additional interlayer insulating layer 160 may be formed of the same material as the first interlayer insulating layer 140.

The additional interlayer insulating layer 160 may have a planarized top surface. For this, the additional interlayer insulating layer 160 may be formed by depositing a thick insulating material over the polishing stop layer 150 and performing a planarization process such as a CMP process on the thick insulating material so that the top surface of the additional interlayer insulating layer 160 is located at a predetermined distance from the polishing stop layer 150 in the first region A.

Figure 3C:
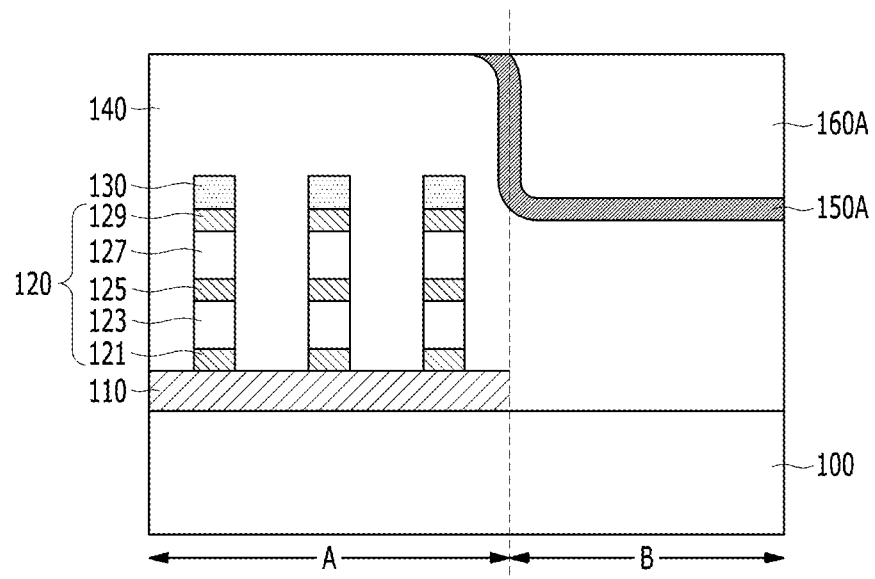

Referring to FIG. 3C, a planarization process, for example, a polishing process such as CMP may be performed on the additional interlayer insulating layer 160 until a top surface of the polishing stop layer 150 of the first region A is exposed. Next, a portion of the polishing stop layer 150 of the first region A which has been exposed by the polishing process may be removed. Although it is easy to remove the additional interlayer insulating layer 160 by the polishing process, it is difficult to remove the polishing stop layer 150 by the polishing process because the polishing stop layer 150 includes a carbon-containing material. Therefore, the removal of the polishing stop layer 150 may be performed by an etching process such as an etchback process. The portions of the polishing stop layer 150 remaining in the boundary between the first region A and the second region B, and in the second region B after the removal of the portion of the polishing stop layer 150 of the first region A may be referred to as an initial polishing stop layer pattern 150A. The portion of the additional interlayer insulating layer remaining in the second region B after the planarization process may be referred to as an additional interlayer insulating layer pattern 160A.

As a result, only the first interlayer insulating layer 140 may remain over the memory cells 120 in the first region A. In the second region B, a stack structure of the first interlayer insulating layer 140, the initial polishing stop layer pattern 150A and the additional interlayer insulating layer pattern 160A may be formed. A top surface of the additional interlayer insulating layer pattern 160A may be located at a height that is substantially the same as a top surface of the first interlayer insulating layer 140 of the first region A, and a bottom surface and a sidewall of the additional interlayer insulating layer pattern 160A may be in contact with corresponding surfaces of the initial polishing stop layer pattern 150A.

Figure 3D:
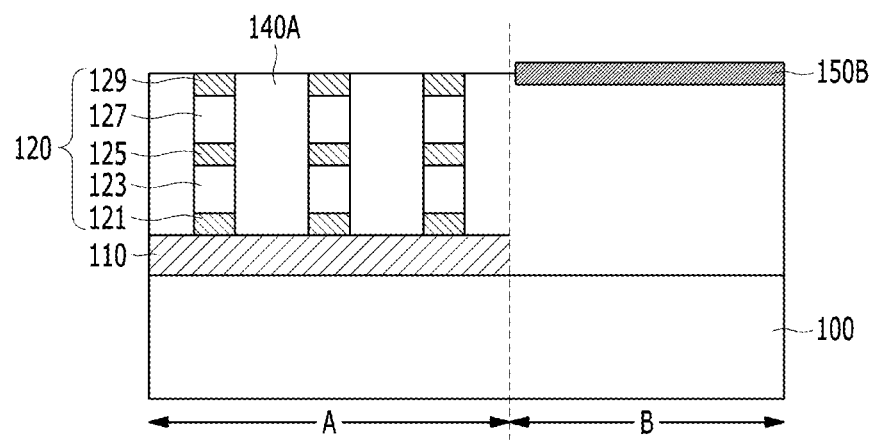

Referring to FIG. 3D, a planarization process, for example, a polishing process such as CMP, may be performed until the upper electrode layer 129, which is located at the uppermost portion of the memory cell 120 of the first region A, is exposed. After this process, portions of the first interlayer insulating layer 140 filling spaces between the memory cells 120 in the first region A and remaining in the second region B may be referred to as a first interlayer insulating layer pattern 140A. Also, after this process, the initial polishing stop layer pattern 150A remaining in the second region B may be referred to as a polishing stop layer pattern 150B, or an insulating carbon-containing pattern 150B.

Since the upper electrode layer 129 includes a conductive carbon-containing material and the polishing stop layer pattern 150B with a top surface that is higher than the top surface of the upper electrode layer 129 is in the second region B, a polishing margin may be improved. That is, even when excessive polishing is performed to completely remove the hard mask pattern 130, the loss of the upper electrode layer 129 may be minimized by the polishing stop layer pattern 150B acting as an etch stop layer. Accordingly, in implementations of this disclosure, heights of the memory cells 120 may be uniform across the entire first region A, so electrical characteristics of the memory cells 120 such as threshold voltages thereof may be uniform.

Furthermore, since the polishing stop layer pattern 150B is disposed over the first interlayer insulating layer pattern 140A of the second region B, the loss of the first interlayer insulating layer pattern 140A may be also minimized in the second region B and the boundary between the first region A and the second region B. As a result, a height of a step between the first region A and the second region B may be minimized. In the first region A, a top surface of the first interlayer insulating layer pattern 140A may be located at substantially the same height as the top surface of the upper electrode layer 129. On the other hand, a top surface of the first interlayer insulating layer pattern 140A under the polishing stop layer pattern 150B in the second region B may be slightly lower than the top surface of the upper electrode layer 129. However, depending on the second height H2 in the above process of FIG. 3B, a height of a top surface of the polishing stop layer pattern 150B in the second region B may be variously modified.

Figure 3E:
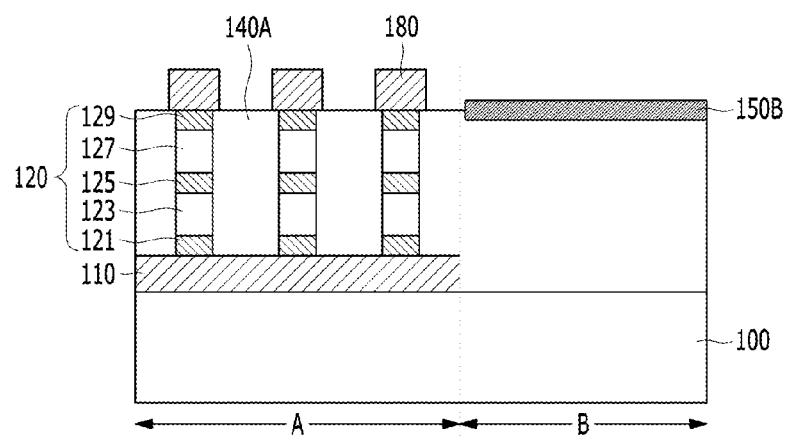

Referring to FIG. 3E, second lines 180 extending in a second direction and coupled to the memory cells 120 of the first region A may be formed over the memory cell structures of FIG. 3D. The second lines 180 may have a single-layered structure or multi-layered structure including a conductive material such as a metal, a metal nitride, etc. The second lines 180 may be formed by depositing a conductive material and performing a patterning process. A space between the second lines 180 may be filled with an insulating material (not shown).

By the aforementioned processes, the semiconductor memory may be formed as illustrated in FIG. 3E.

Referring again to FIG. 3E, the semiconductor memory may include the substrate 100 including the first region A in which the memory cells 120 are disposed and the second region B adjacent to the first region A. The first lines 110 is disposed over the substrate 100 of the first region A and extends in the first direction. The first interlayer insulating layer pattern 140A covers the first lines 110 of the first region A and the substrate 100 of the second region B. The memory cells 120 penetrates through the first interlayer insulating layer pattern 140A of the first region A to be coupled to the first lines 110. The second lines 180 is located over the first interlayer insulating layer pattern 140A of the first region A and the memory cells 120 and extends in the second direction crossing the first direction. The polishing stop layer pattern 150B is formed over the first interlayer insulating layer pattern 140A of the second region B.

Each of the memory cells 120 may include the upper electrode layer 129 which includes a conductive carbon-containing material such as graphite, carbon nanotubes, etc., and is located at the uppermost portion of the memory cell 120. The polishing stop layer pattern 150B may include an insulating carbon-containing material such as SiC, SiCN, SiOC, SiOCN, DLC (Diamond-like carbon) or amorphous carbon. The polishing stop layer pattern 150B may be located at a height similar to the upper electrode layer 129 in the vertical direction. Specifically, a portion of the polishing stop layer pattern 150B may overlap with at least a portion of the upper electrode layer 129 in the vertical direction, and the top surface of the polishing stop layer pattern 150B may be located at a height equal to or greater than the top surface of the upper electrode layer 129.

Therefore, a polishing margin may be improved, characteristics of the memory cells 120 may be uniform, and a height difference between the first region A and the second region B may be reduced.

One of the first line 110 and the second line 180 may serve as a word line, and the other of the first line 110 and the second line 180 may serve as a bit line. Each of the memory cells 120 may operate to store data according to a voltage or current supplied through a coupled word line and a coupled bit line.

Meanwhile, in the first region A of the above semiconductor memory, two or more cross-point structures each including first lines, second lines, and memory cells located at intersections of the first lines and the second lines between the first lines and the second lines may be stacked in the vertical direction. Examples of such structures will be described with reference to FIGS. 4 and 5.

Figure 4:
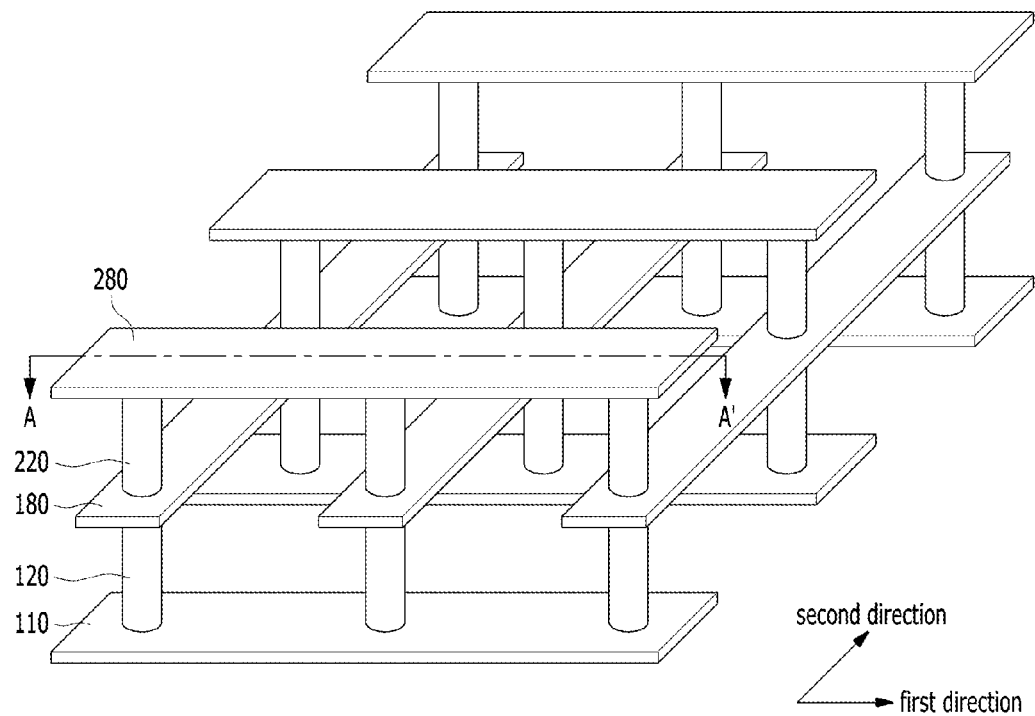
FIG. 4 is a perspective view illustrating a semiconductor memory according to another implementation of the disclosed technology.

FIG. 4 is a perspective view illustrating a semiconductor memory according to another implementation of the disclosed technology.

Referring to FIG. 4, the semiconductor memory of the present implementation may include first lines 110 extending in a first direction, second lines 180 located over the first lines 110 and extending in a second direction crossing the first direction, third lines 280 located over the second lines 180 and extending in the first direction, first memory cells 120 located at intersections of the first lines 110 and the second lines 180 between the first lines 110 and the second lines 180, and second memory cells 220 located at intersections of the second lines 180 and the third lines 280 between the second lines 180 and the third lines 280, in a memory cell region.

A first cross-point structure may include the first lines 110, the first memory cells 120 and the second lines 180, and a second cross-point structure may include the second lines 180, the second memory cells 220 and the third lines 280. The second lines 180 may be common lines used in both the first cross-point structure and the second cross-point structure, for example, common bit lines or common word lines. The first memory cells 120 of the first cross-point structure may be driven by the first lines 110 and the second lines 180, and the second memory cells 220 of the second cross-point structure may be driven by the second lines 180 and the third lines 280.

A first region A of FIG. 5, which will be described below, is illustrated from the perspective of a cross-sectional view taken along line A-A' of FIG. 4.

Figure 5:
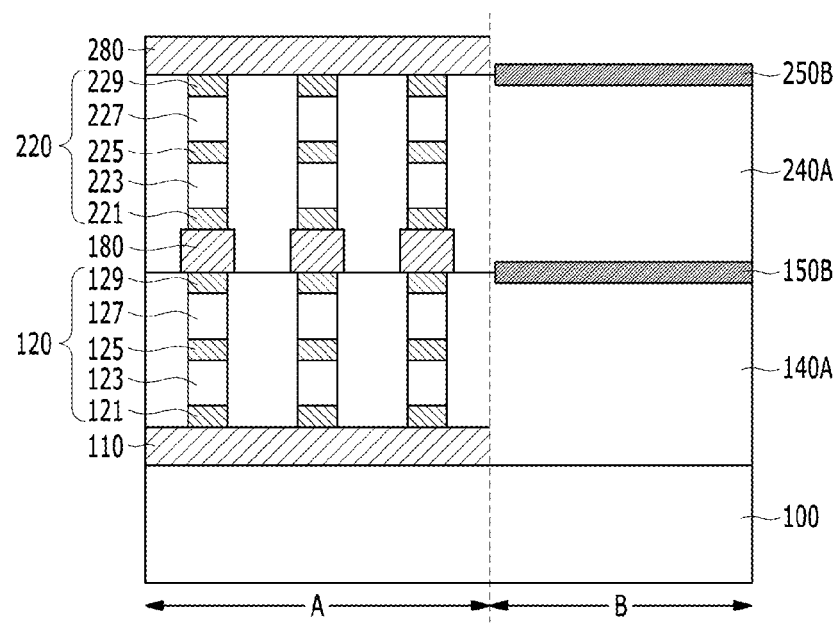
FIG. 5 is a cross-sectional view illustrating a semiconductor memory according to another implementation of the disclosed technology, and a method for fabricating the same.

FIG. 5 is a cross-sectional view illustrating a semiconductor memory according to another implementation of the disclosed technology, and a method for fabricating the same.

Referring to FIG. 5, the semiconductor memory may include a first structure and a second structure. The first structure may include first lines 110 located over a substrate 100 of a first region A and extending in a first direction, a first interlayer insulating layer pattern 140A covering the first lines 110 of the first region A and the substrate 100 of a second region B, first memory cells 120 penetrating through the first interlayer insulating layer pattern 140A of the first region A to be coupled to the first lines 110, second lines 180 located over the first interlayer insulating layer pattern 140A of the first region A and the first memory cells 120 and extending in a second direction crossing the first direction, and a first polishing stop layer pattern 150B formed over the first interlayer insulating layer pattern 140A of the second region B. The second structure may include a second interlayer insulating layer pattern 240A covering the first structure, second memory cells 220 penetrating through the second interlayer insulating layer pattern 240A of the first region A to be coupled to the second lines 180, third lines 280 located over the second interlayer insulating layer pattern 240A of the first region A and the second memory cells 220 and extending in the first direction, and a second polishing stop layer pattern 250B formed over the second interlayer insulating layer pattern 240A of the second region B.

Here, a fabricating method of the second structure may be substantially same as a fabricating method of the first structure, except for the forming of the first lines 110. Therefore, the second structure may have a substantially same structure as the first structure, except for the first lines 110. For example, when the first memory cell 120 includes a first lower electrode layer 121, a first selection element layer 123, a first middle electrode layer 125, a first variable resistance layer 127 and a first upper electrode layer 129 which are sequentially stacked, the second memory cell 220 may include a second lower electrode layer 221, a second selection element layer 223, a second middle electrode layer 225, a second variable resistance layer 227 and a second upper electrode layer 229 which are sequentially stacked. The first and second upper electrode layers 129 and 229 may include a conductive carbon-containing material, and the first and second polishing stop layer patterns 150B and 250B may include an insulating carbon-containing material.

Therefore, in implementations of this disclosure, a polishing margin may be improved, characteristics of the first and second memory cells 120 and 220 may be uniform, and a height difference between the first region A and the second region B may be reduced.

Furthermore, the insulating carbon-containing material included in the first and second polishing stop layer patterns 150B and 250B may have a heat shielding characteristic. This characteristic may be improved as carbon content of the insulating carbon-containing material increases. Therefore, the second memory cells 220 may not be affected by the heat generated during the operation of the first memory cells 120. Also, the first memory cells 120 may not be affected by the heat generated during the operation of the second memory cells 220. That is, thermal interference between the first cross-point structure and the second cross-point structure which are stacked in the first region A may be minimized by at least the first polishing stop layer pattern 150B. As a result, operating characteristics of the semiconductor memory may be improved.

In the present implementation, two cross-point structures have been described. However, three or more cross-point structures may be stacked. In this case, three or more polishing stop layer patterns corresponding to the three or more cross-point structures, respectively, may be formed in the second region B, thereby blocking thermal interference between the cross-point structures.

The above and other memory circuits or semiconductor devices based on the disclosed technology can be used in a range of devices or systems. FIGS. 6-10 provide some examples of devices or systems that can implement the memory circuits disclosed herein.

Figure 6:
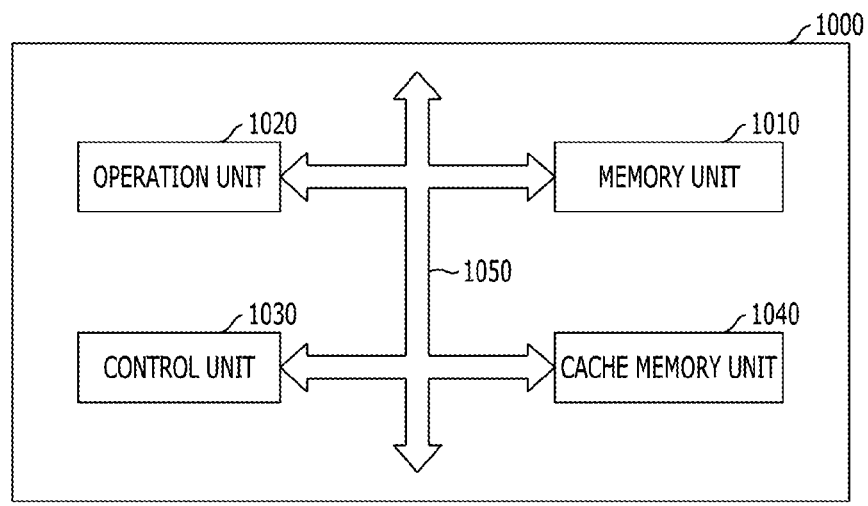
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region. Through this, fabricating processes of the memory unit 1010 may be easy, and characteristics of memory cells of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
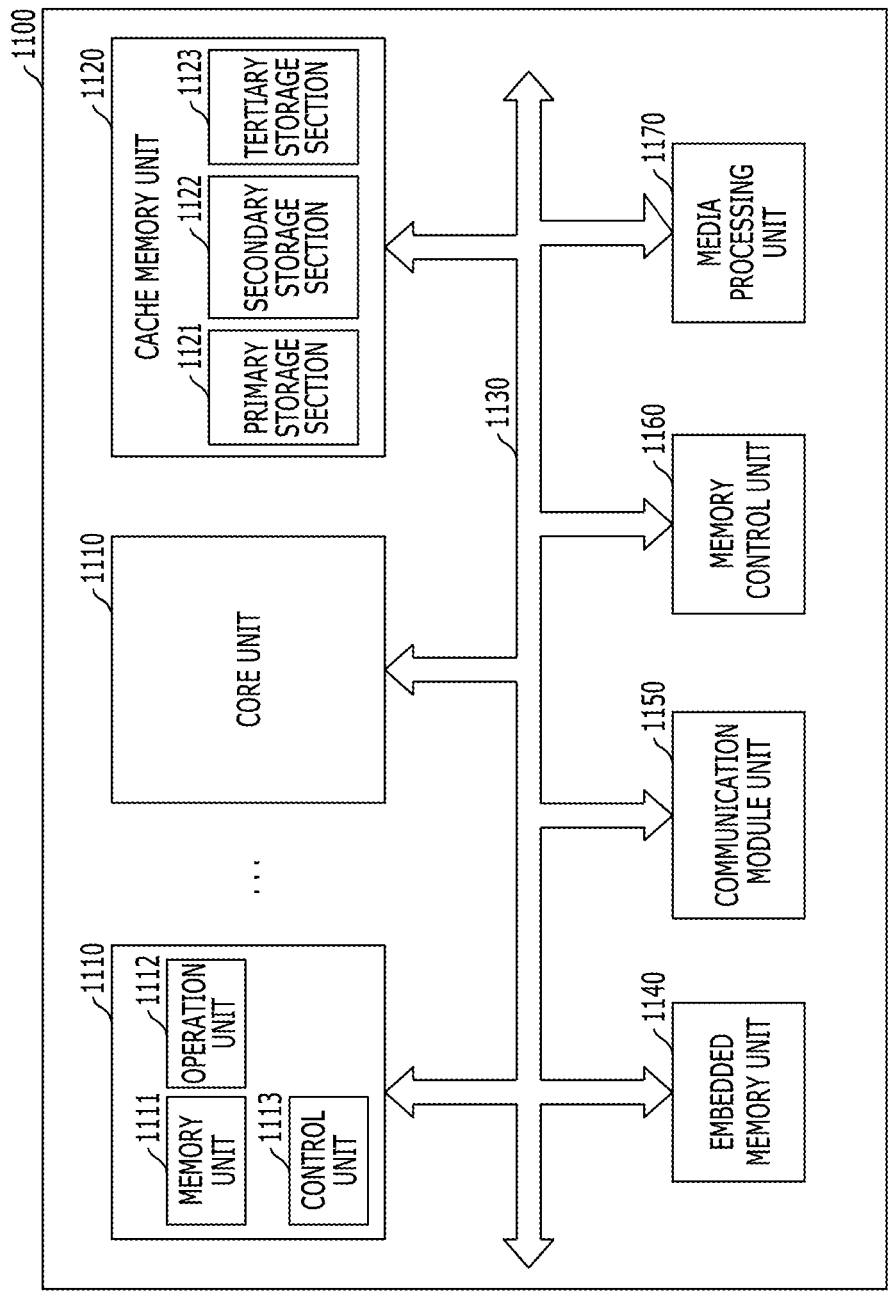
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region. Through this, fabricating processes of the cache memory unit 1120 may be easy, and characteristics of memory cells of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
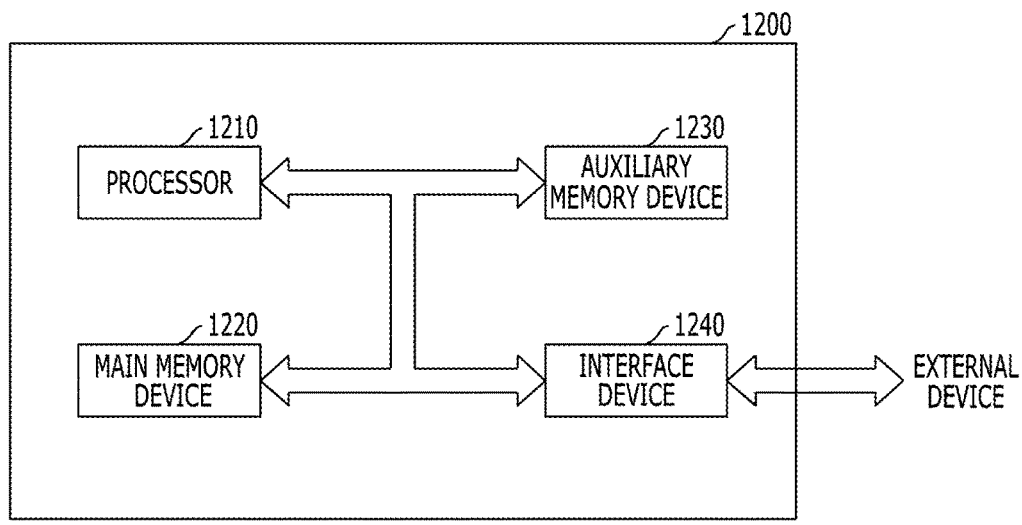
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region. Through this, fabricating processes of the main memory device 1220 may be easy, and characteristics of memory cells of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region. Through this, fabricating processes of the auxiliary memory device 1230 may be easy, and characteristics of memory cells of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
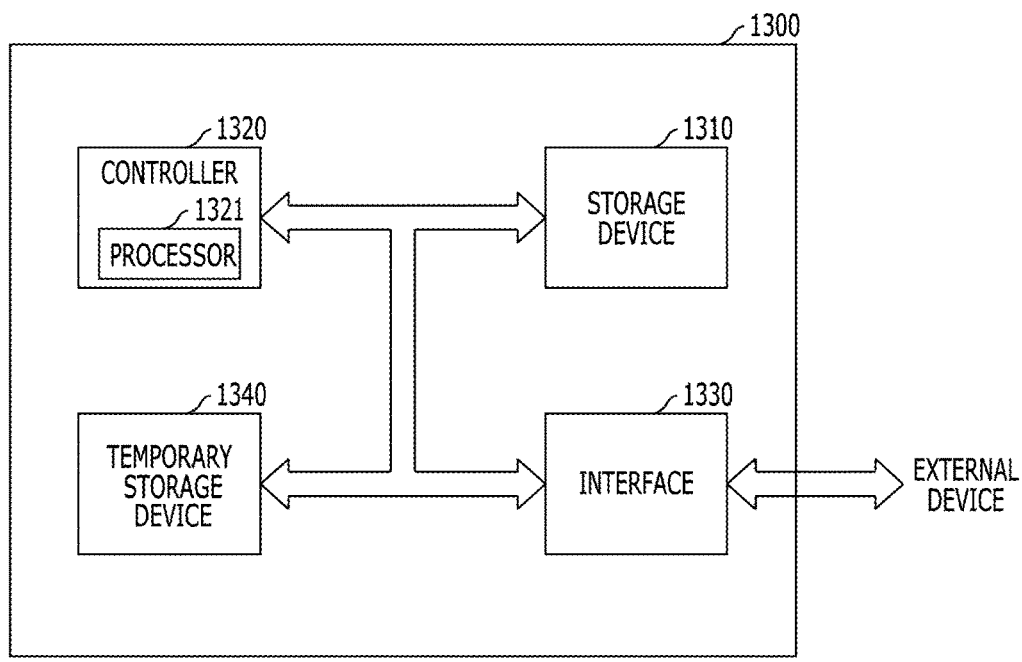
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region. Through this, fabricating processes of the temporary storage device 1340 may be easy, and characteristics of memory cells of the temporary storage device 1340 may be improved. As a consequence, operating characteristics and data storage characteristics of the data storage system 1300 may be improved.

Figure 10:
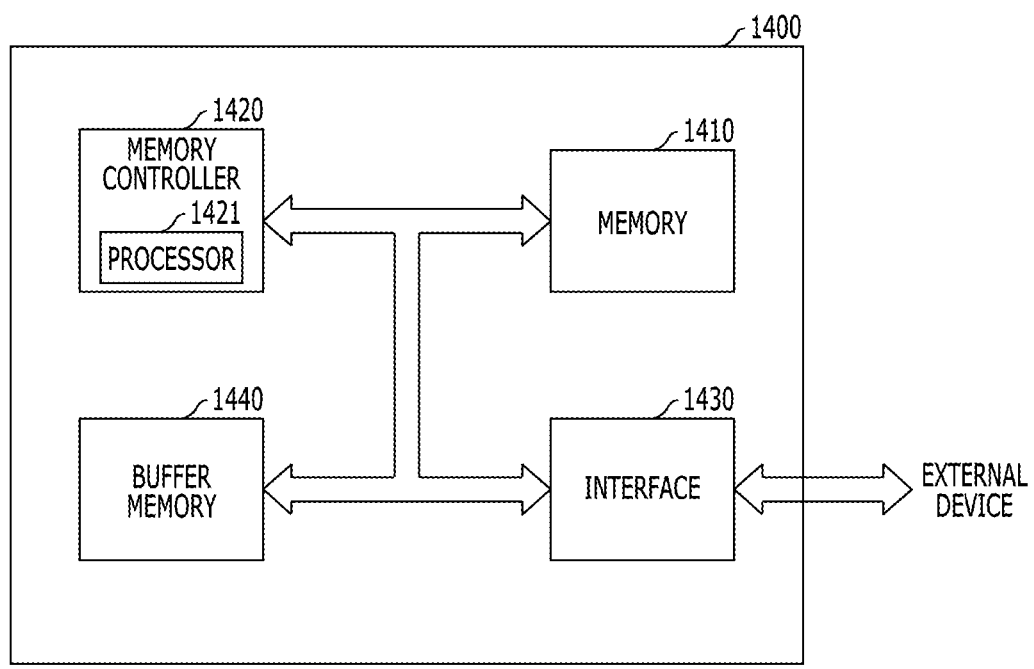
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region. Through this, fabricating processes of the memory 1410 may be easy, and characteristics of memory cells of the memory 1410 may be improved. As a consequence, operating characteristics and memory characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate including a first region in which a plurality of memory cells are disposed and a second region adjacent to the first region; a first interlayer insulating layer disposed over the substrate; a plurality of first memory cells penetrating through the first interlayer insulating layer in the first region, an uppermost portion of each memory cell of the first memory cells having a first conductive carbon-containing pattern; and a first insulating carbon-containing pattern located over the first interlayer insulating layer in the second region. Through this, fabricating processes of the buffer memory 1440 may be easy, and characteristics of memory cells of the buffer memory 1440 1010 may be improved. As a consequence, operating characteristics and memory characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a substrate including a first region in which a plurality of memory cells are disposed and a second region adjacent to the first region;
   a first interlayer insulating layer disposed over the substrate;
   a plurality of first memory cells penetrating through the first interlayer insulating layer in the first region, an uppermost portion of each memory cell of the first memory cells having a first conductive carbon-containing pattern; and
   a first insulating carbon-containing pattern located over the first interlayer insulating layer in the second region.

2. The electronic device of claim 1, wherein the first conductive carbon-containing pattern includes graphite or carbon nanotubes.

3. The electronic device of claim 1, wherein the first insulating carbon-containing pattern includes SiC, SiCN, SiOC, SiOCN, DLC (Diamond-like carbon) or amorphous carbon.

4. The electronic device of claim 3, wherein the first insulating carbon-containing pattern has a carbon content of from 10 wt % to 100 wt %.

5. The electronic device of claim 1, wherein a height of a top surface of the first insulating carbon-containing pattern is equal to or greater than a height of a top surface of each first conductive carbon-containing pattern.

6. The electronic device of claim 5, wherein a height of a bottom surface of the first insulating carbon-containing pattern is equal to or less than the height of the top surface of each first conductive carbon-containing pattern while being equal to or greater than a height of a bottom surface of each first conductive carbon-containing pattern.

7. The electronic device of claim 1, wherein a height of a portion of a top surface of the first interlayer insulating layer in the first region is substantially equal to a height of a top surface of the first conductive carbon-containing pattern.

8. The electronic device of claim 7, wherein a height of a portion of a top surface of the first interlayer insulating layer under the first insulating carbon-containing pattern in the second region is less than the height of the portion of the top surface of the first interlayer insulating layer in the first region.

9. The electronic device of claim 1, wherein the semiconductor memory further comprises:
a plurality of first lines disposed over the substrate and under the first memory cells in the first region and extending in a first direction; and
a plurality of second lines disposed over the first interlayer insulating layer in the first region, and extending in a second direction crossing the first direction while contacting the first conductive carbon-containing patterns,
wherein the first memory cells are located at intersections of the first lines and the second lines.

10. The electronic device of claim 1, wherein each of the first memory cells includes a variable resistance layer which switches between different resistance states according to an applied voltage or current, and
wherein the first conductive carbon-containing pattern is located over the variable resistance layer.

11. The electronic device of claim 10, wherein each of the first memory cells further includes a selection element layer which controls access to the variable resistance layer, and
wherein the selection element layer is located under the variable resistance layer or between the first conductive carbon-containing pattern and the variable resistance layer.

12. The electronic device of claim 9, wherein the semiconductor memory further comprises:
a second interlayer insulating layer covering the first interlayer insulating layer, the second lines and the first insulating carbon-containing pattern;
a plurality of second memory cells disposed in the first region, penetrating through a first portion of the second interlayer insulating layer in the first region and coupled to the second lines, an uppermost portion of each of the second memory cells having a second conductive carbon-containing pattern;
a second insulating carbon-containing pattern located over a second portion of the second interlayer insulating layer in the second region; and
a plurality of third lines disposed over the second interlayer insulating layer in the first region, and extending in the first direction while contacting the second conductive carbon-containing patterns,
wherein the second memory cells are located at intersections of the second lines and the thirds lines.

13. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

14. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

15. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

16. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

17. The electronic device according to claim 1, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside,
- wherein the semiconductor memory is part of the memory or the buffer memory in the memory system.

* * * * *